US012720894B2

(12) United States Patent
Kim et al.

(10) Patent No.: US 12,720,894 B2
(45) Date of Patent: Aug. 25, 2026

(54) NANO-POST IMAGE SENSOR, AND ELECTRONIC DEVICE COMPRISING THE NANO-POST IMAGE SENSOR

(71) Applicant: SAMSUNG ELECTRONICS CO., LTD., Suwon-si (KR)

(72) Inventors: Junghun Kim, Suwon-si (KR); Chulsoo Choi, Suwon-si (KR); Jonghoon Park, Suwon-si (KR); Yunki Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 497 days.

(21) Appl. No.: 18/207,546

(22) Filed: Jun. 8, 2023

(65) Prior Publication Data

US 2024/0055455 A1 Feb. 15, 2024

(30) Foreign Application Priority Data

Aug. 9, 2022 (KR) ........................ 10-2022-0099504

(51) Int. Cl.
*H10F 39/00* (2025.01)
*G02B 3/08* (2006.01)
*H10F 39/18* (2025.01)

(52) U.S. Cl.
CPC ........... *H10F 39/8063* (2025.01); *G02B 3/08* (2013.01); *H10F 39/024* (2025.01); *H10F 39/182* (2025.01); *G02B 2207/101* (2013.01)

(58) Field of Classification Search
CPC ........................... H10F 39/8053; H10F 39/806
See application file for complete search history.

(56) References Cited

U.S. PATENT DOCUMENTS 7,112,511 B2 9/2006 Hong
11,175,182 B2 11/2021 Kim et al.
(Continued)

FOREIGN PATENT DOCUMENTS

KR 10-2007-0055865 A 5/2007
KR 102129415 B1 * 7/2020 .............. C08K 3/08
(Continued)

OTHER PUBLICATIONS

Yang, Y., et al., "Revealing Structural Disorder in Hydrogenated Amorphous Silicon for a Low-Loss Photonic Platform at Visible Frequencies" Advanced Materials, (2021), 33, 2005893, pp. 1-9, DOI: 10.1002/adma.202005893.
(Continued)

*Primary Examiner* — William B Partridge
*Assistant Examiner* — Felix B Andrews
(74) *Attorney, Agent, or Firm* — Sughrue Mion, PLLC

(57) ABSTRACT

An image sensor is provided. The image sensor includes: a photodetector with a plurality of photodetection cells; an interlayer device provided on the photodetector; and a color separation lens layer including a plurality of nano-posts disposed on the interlayer device and spaced apart from each other, the plurality of nano-posts focusing light of different spectra to at least two of the plurality of photodetection cells. Each of the plurality of nano-posts includes a first refractive layer having a first refractive index and a cylindrical shape, and a second refractive layer having a second refractive index and surrounding bottom and side surfaces of the first refractive layer, and the second refractive index is higher than the first refractive index.

20 Claims, 12 Drawing Sheets

(56) References Cited

U.S. PATENT DOCUMENTS

| | | | | |
|---|---|---|---|---|
| 2009/0050200 | A1* | 2/2009 | Chen | H10F 77/1662 136/258 |
| 2015/0340396 | A1 | 11/2015 | Blayvas | |
| 2017/0138858 | A1* | 5/2017 | Astier | G01N 21/6428 |
| 2020/0403023 | A1* | 12/2020 | Huang | H04N 25/76 |
| 2021/0125301 | A1 | 4/2021 | Park et al. | |
| 2021/0126032 | A1 | 4/2021 | Roh et al. | |
| 2021/0167110 | A1 | 6/2021 | Roh et al. | |
| 2021/0249459 | A1 | 8/2021 | Yun et al. | |

FOREIGN PATENT DOCUMENTS

| | | | | | |
|---|---|---|---|---|---|
| KR | 10-2020-0146008 | A | | 12/2020 | |
| KR | 20210066705 | A | * | 6/2021 | G02B 5/20 |
| WO | WO-2010134677 | A1 | * | 11/2010 | C23C 14/564 |
| WO | WO-2021209964 | A1 | * | 10/2021 | G02B 5/26 |

OTHER PUBLICATIONS

Office Action issued Mar. 16, 2026 by the Korean Ministry of Intellectual Property for KR Patent Application No. 10-2022-0099504.

* cited by examiner

1100

| P1 | P2 | P1 | P2 | P1 | P2 | P1 | P2 |
|---|---|---|---|---|---|---|---|
| P3 | P1 | P3 | P1 | P3 | P1 | P3 | P1 |
| P1 | P2 | P1 | P2 | P1 | P2 | P1 | P2 |
| P3 | P1 | P3 | P1 | P3 | P1 | P3 | P1 |
| P1 | P2 | P1 | P2 | P1 | P2 | P1 | P2 |
| P3 | P1 | P3 | P1 | P3 | P1 | P3 | P1 |

| 110 | 120 | 110 | 120 | 110 | 120 | 110 | 120 |
|---|---|---|---|---|---|---|---|
| 130 | 140 | 130 | 140 | 130 | 140 | 130 | 140 |
| 110 | 120 | 110 | 120 | 110 | 120 | 110 | 120 |
| 130 | 140 | 130 | 140 | 130 | 140 | 130 | 140 |
| 110 | 120 | 110 | 120 | 110 | 120 | 110 | 120 |
| 130 | 140 | 130 | 140 | 130 | 140 | 130 | 140 |

NANO-POST IMAGE SENSOR, AND ELECTRONIC DEVICE COMPRISING THE NANO-POST IMAGE SENSOR

CROSS-REFERENCE TO RELATED APPLICATION

This application claims priority to Korean Patent Application No. 10-2022-0099504, filed on Aug. 9, 2022, in the Korean Intellectual Property Office, the disclosure of which is incorporated by reference herein in its entirety.

BACKGROUND

The present disclosure relates to an image sensor, and more particularly, to an image sensor having a color separation lens layer, and an electronic device including the image sensor.

The image sensor typically detects color of incident light by using a color filter. However, because the color filter absorbs light of a color other than the light of the corresponding color, light utilization efficiency may be reduced. For example, when a red, green, and blue (RGB) color filter is used, only ⅓ of the incident light is transmitted and the remaining ⅔ is absorbed, so that the light utilization efficiency of the RGB color filter is merely about 33% and optical loss is very high. A color separation lens layer may be used instead of a color filter to improve the light utilization efficiency of an image sensor. The color separation lens layer separates the colors of the incident light by using diffraction or refraction characteristics of light that are different from one another according to wavelength, and can adjust the directionality for each wavelength according to the refractive index and shape of the color separation lens layer. The colors separated by the color separation lens layer may be transmitted to each corresponding pixel.

SUMMARY

The present disclosure provides an image sensor having a color separation lens layer with an improved refractive index, and an electronic device including the image sensor.

In addition, the problems to be solved by the present disclosure are not limited to the above-described problems, and some other problems are clearly understood by one of ordinary skill in the art from the following descriptions hereinafter.

According to an aspect of an example embodiment, an image sensor includes: a photodetector including a plurality of photodetection cells; an interlayer device provided on the photodetector; and a color separation lens layer including a plurality of nano-posts disposed on the interlayer device and spaced apart from each other, the plurality of nano-posts focusing light of different spectra to at least two of the plurality of photodetection cells. Each of the plurality of nano-posts includes a first refractive layer having a first refractive index and a cylindrical shape, and a second refractive layer having a second refractive index and surrounding bottom and side surfaces of the first refractive layer, and the second refractive index is higher than the first refractive index.

According to an aspect of an example embodiment, an image sensor including: a photodetector including a plurality of photodetection cells; and a color separation lens layer provided over the photodetector and configured to focus light to the plurality of photodetection cells, the color separation lens layer including a plurality of nano-posts spaced apart from each other in a horizontal direction by a plurality of spacer layers. Each of the plurality of nano-posts includes a first refractive layer having a first refractive index and a cylindrical shape, and a second refractive layer having a second refractive index, and surrounding bottom and side surfaces of the first refractive layer, and the second refractive index is higher than the first refractive index.

According to an aspect of an example embodiment, an electronic device includes: an imaging device configured to generate an optical image by focusing light reflected from an object; an image sensor configured to convert the optical image into an electrical signal; and a processor configured to control the imaging device and the image sensor. The image sensor includes nano-posts which focus light of different spectra to at least two of a plurality of photodetection cells, each of the nano-posts includes a first refractive layer having a first refractive index and a cylindrical shape, and a second refractive layer having a second refractive index and surrounding bottom and side surfaces of the first refractive layer, and the second refractive index is higher than the first refractive index.

BRIEF DESCRIPTION OF DRAWINGS

The above and other aspects and features will be more clearly understood from the following description, taken in conjunction with the accompanying drawings, in which.

DETAILED DESCRIPTION

Hereinafter, example embodiments are described in conjunction with the accompanying drawings. Each example embodiment provided in the following description is not excluded from being associated with one or more features of another example or another example embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
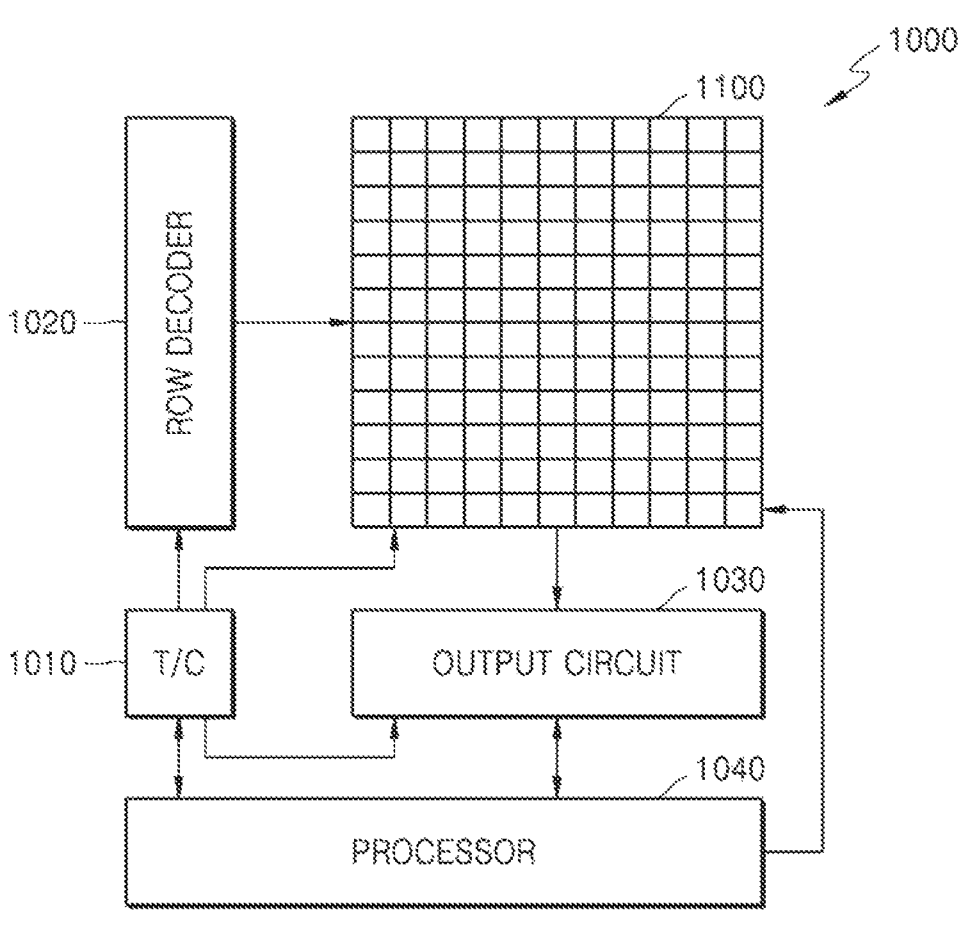
FIG. 1 is a block diagram of an image sensor, according to an example embodiment.

FIG. 1 is a block diagram of an image sensor according to an example embodiment.

Referring to FIG. 1, an image sensor 1000 according to an example embodiment may include a pixel array 1100, a timing controller 1010, a row decoder 1020, an output circuit 1030, and a processor 1040. The processor 1040 may control the pixel array 1100, the timing controller 1010, and the output circuit 1030, and process an image signal output from the output circuit 1030. The image sensor 1000 of an example embodiment may be, for example, a Charge Coupled Device (CCD) image sensor or a Complementary Metal Oxide Semiconductor (CMOS) image sensor.

The pixel array 1100 may include a plurality of pixels arranged in a two-dimensional array structure along a plurality of rows and a plurality of columns. The row decoder 1020 may select at least one row among a plurality of rows of the pixel array 1100 based on a row address signal output from the timing controller 1010. The output circuit 1030 may output a light sensing signal from a plurality of pixels connected to the selected row in column units. The output circuit 1030 may include an analog-to-digital converter (ADC). For example, the output circuit 1030 may include a plurality of ADCs respectively arranged for the plurality of columns, and each ADC may include a comparator for comparing a pixel light sensing signal to a reference signal and a converter for converting the comparator output signal into digital data. In some example embodiments, the timing controller 1010, the row decoder 1020, the output circuit 1030, and the processor 1040 may be arranged on a second semiconductor substrate that is different from a first semiconductor substrate of the pixel array 1100. The first semiconductor substrate and the second semiconductor substrate may be stacked on each other, and electrically connected to exchange row address signals and light sensing signals therebetween.

Figure 2:
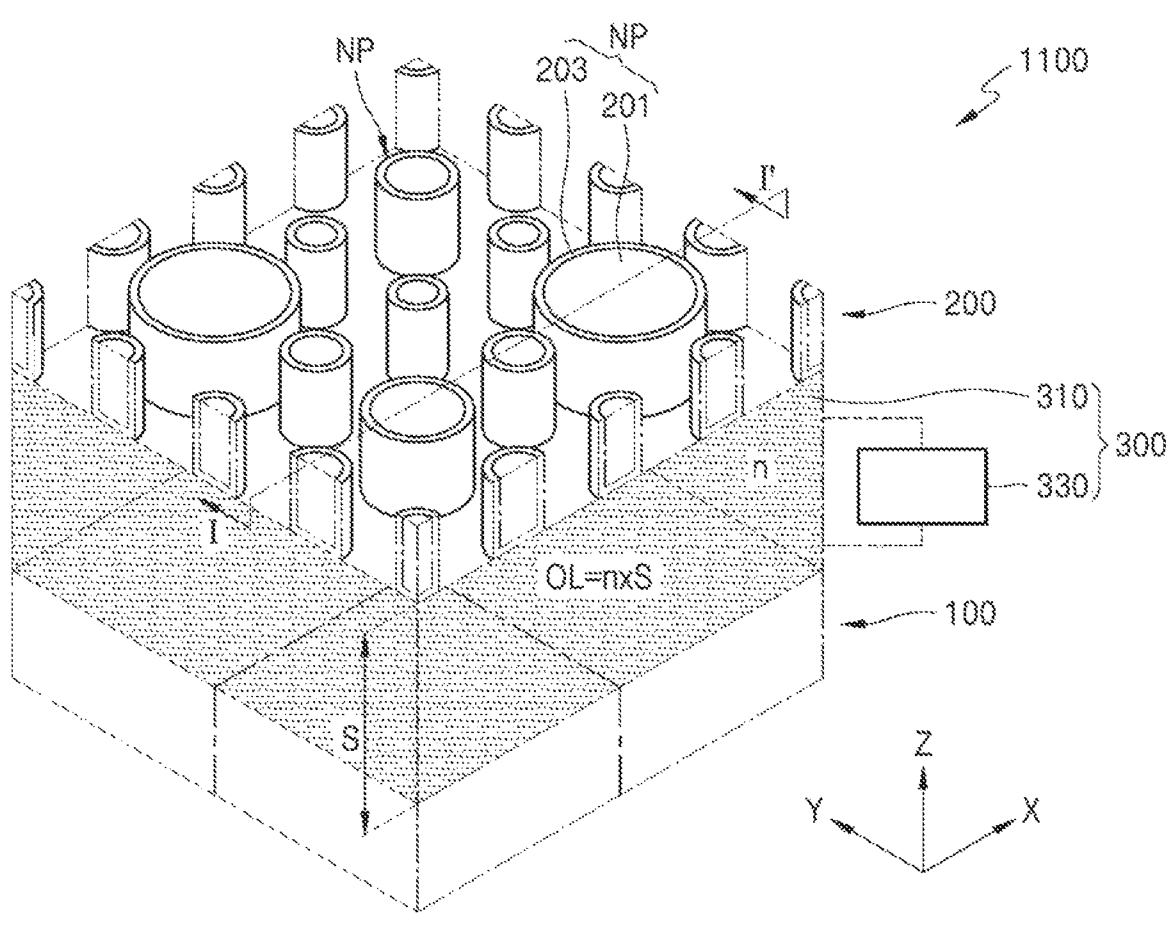
FIG. 2 is a conceptual view schematically illustrating a pixel array structure of the image sensor shown in FIG. 1.
Figure 3:
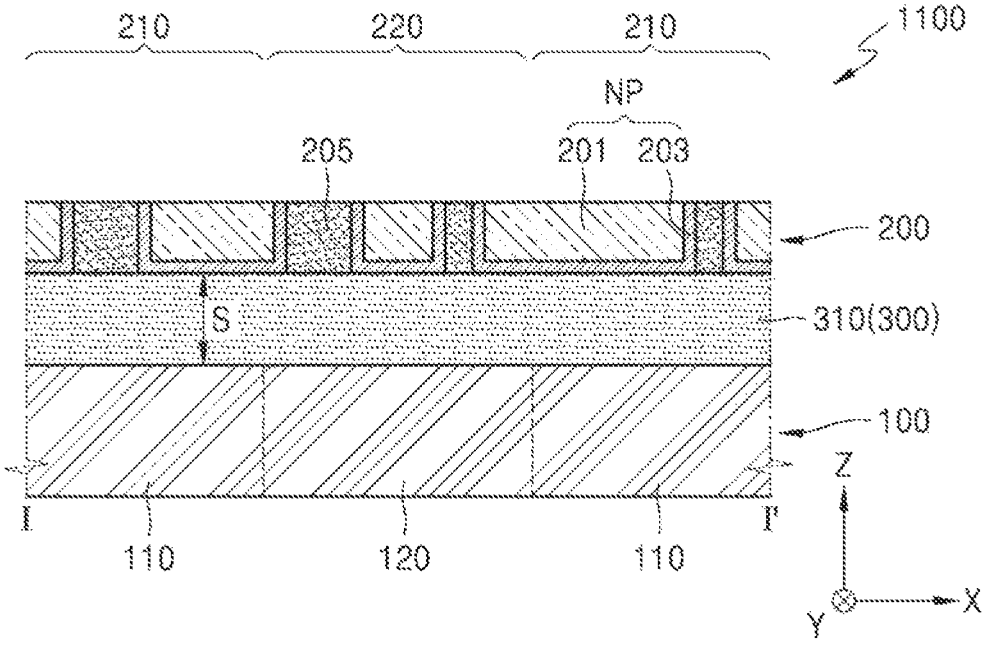
FIG. 3 is a cross-sectional view cut along a line IT of FIG. 2.
Figure 4A:
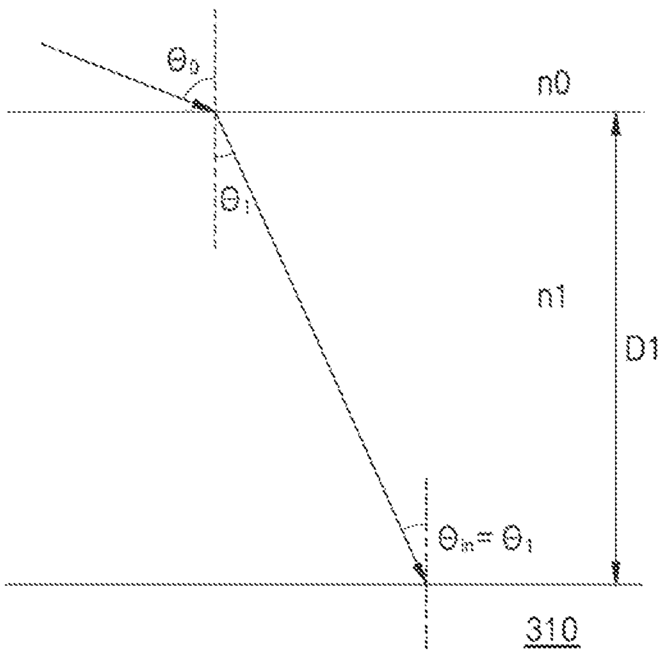
FIGS. 4A and 4B are conceptual views for explaining the effect of a color separation lens layer in the image sensor of FIG. 1, according to the structure of a nano-post.
Figure 4B:
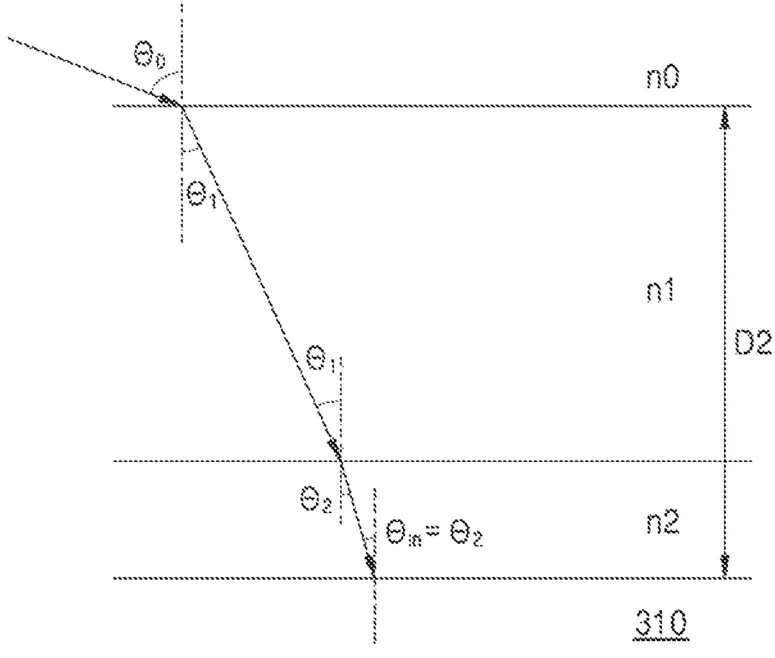

FIG. 2 is a conceptual view schematically illustrating a pixel array structure of the image sensor shown in FIG. 1, FIG. 3 is a cross-sectional view cut along a line IT of FIG. 2, and FIGS. 4A and 4B are conceptual views for explaining the effect of a color separation lens layer in the image sensor of FIG. 1 according to the structure of a nano-post. It will be explained together with reference to FIG. 1, and redundant descriptions already given with reference to FIG. 1 will be briefly described or omitted.

Referring to FIGS. 2 to 4B, the pixel array 1100 may include a photodetector 100, a color separation lens layer 200, and a variable interlayer device 300. The photodetector 100 may include a plurality of photodetection cells for sensing light. In the image sensor 1000 of an example embodiment, a photodetection cell may include, for example, a photo-diode (PD). However, the photodetection cell is not limited to a PD. The color separation lens layer 200 may be disposed on the variable interlayer 310 and may include a plurality of nano-posts NP. The variable interlayer device 300 may adjust an optical length (OL) between the photodetector 100 and the color separation lens layer 200. For example, the optical length OL may be expressed as a product of a refractive index n and a distance S of a height of the variable interlayer 310 of the variable interlayer device 300. That is, OL=n*S.

The color separation lens layer 200 may branch incident light to cause light of different wavelength spectrums to be incident on at least two different photodetection cells of the photodetector 100. To this end, in the color separation lens layer 200, the size, position, and arrangement of the nano-posts NP may be appropriately set. The color separation lens layer 200 may include a plurality of regions respectively facing the plurality of photodetection cells. In addition, the incident light may have a predetermined phase distribution immediately after passing through the color separation lens layer 200, and the predetermined phase distribution may depend on an arrangement relationship between each region and the plurality of nano-posts NP. Light of such a phase distribution may pass through the color separation lens layer 200 and travel a predetermined distance, and then be incident on a plurality of photodetection cells of the photodetector 100. In this regard, the wavelength spectrum of the light incident on the photodetection cells may be determined according to the predetermined distance. Herein, the predetermined distance may correspond to the aforementioned optical length OL.

The color separation lens layer 200 may include the nano-post NP and a spacer layer 205. As can be seen from FIGS. 2 and 3, the nano-post NP may have a cylindrical shape. However, the shape of the nano-post NP is not limited to a cylindrical shape. The nano-posts NP may have various sizes and be spaced apart from each other on the upper surface of the variable interlayer 310. The spacer layer 205 may fill a gap space between the nano-posts NP. The spacer layer 205 may include a material having a lower refractive index than that of a material of the nano-post NP. For example, the spacer layer 205 may include silicon oxide ($SiO_2$). However, the material of the spacer layer 205 is not limited to silicon oxide ($SiO_2$).

The nano-post NP may include a first refractive layer 201 and a second refractive layer 203. The first refractive layer 201 may constitute a central body of the nano-post NP, and may have a cylindrical shape corresponding to the shape of the nano-post NP. However, when the shape of the nano-post NP is not a cylinder, the shape of the first refractive layer 201 may not be a cylinder. The second refractive layer 203 may have a shape surrounding bottom and side surfaces of the first refractive layer 201.

The first refractive layer 201 and the second refractive layer 203 may be formed of a material having a higher refractive index than that of the spacer layer 205. In general, a high refractive index can be defined based on silicon oxide ($SiO_2$). For example, each of the first refractive layer 201 and the second refractive layer 203 may include any one of silicon nitride ($SiN_3$, $Si_3N_4$), zinc sulfide (ZnS), gallium nitride (GaN), zinc selenide (ZnSe), titanium oxide ($TiO_2$), and hydrogen-doped amorphous silicon (a-Si:H). In addition, the second refractive layer 203 may have a higher refractive index than the first refractive layer 201. For example, in the image sensor 1000 of an example embodiment, the first refractive layer 201 may include titanium oxide ($TiO_2$) and the second refractive layer 203 may include hydrogen-doped amorphous silicon (a-Si:H). However, the materials of the first refractive layer 201 and the second refractive layer 203 are not limited thereto.

For reference, the color separation lens layer 200 may separate the color of the incident light by using a nano-prism spectroscopic effect of the nano-post NP, and the separated light may be incident on the corresponding photodetection cell of the photodetector 100. The spectral effect of the nano-post NP may be increased by increasing the difference in refractive index with the spacer layer 205. The spectral characteristics of the nano-post NP may be caused by a phase difference distribution between light passing through the nano-post NP and light passing through the spacer layer 205. In addition, as the relative refractive index difference between the nano-post NP and the spacer layer 205 increases, the thickness of the nano-post NP may be reduced. Such a low thickness of the nano post NP may reduce an aspect ratio and thus the difficulties of the etching process.

Hydrogen-doped amorphous silicon (a-Si:H) has the highest refractive index, followed by titanium oxide ($TiO_2$). However, in hydrogen-doped amorphous silicon (a-Si:H), the attenuation coefficient (k value of the imaginary part in the complex refractive index) is not 0, so the k value is lowered by the hydrogen doping. Nevertheless, because the k value still exists, when the entire nano-post NP is formed of hydrogen-doped amorphous silicon (a-Si:H), a loss may occur in the Quantum Efficiency (QE) characteristics of the image sensor.

In the image sensor 1000 of an example embodiment, the first refractive layer 201, which is the central body of the nano-post NP, may be formed of titanium oxide ($TiO_2$), and the first refractive layer 201 may be formed in such a configuration that the first refractive layer 201 is enclosed by the second refractive layer 203 of hydrogen-doped amorphous silicon (a-Si:H), to thereby provide the nano-post NP. Accordingly, the nano-post NP of an example embodiment may have a refractive index that is higher than a nano-post that only includes titanium oxide ($TiO_2$). Accordingly, the image sensor 1000 of an example embodiment may the thickness of the nano-post NP may be reduced and the nano-prism spectral characteristics may be optimally maintained due to the double-layered nano-post NP. In addition, as the thickness of the nano-post NP is minimized, the color separation lens layer 200 may be more easily formed due to a decrease in the aspect ratio of the nano-post NP.

FIG. 4A shows refraction characteristics of light in a structure in which the nano-post NP is formed as a single layer, such as a first refractive layer n1, and FIG. 4B shows refraction characteristics of light in a structure in which the nano-post NP is formed as a dual layer structure including the first refractive layer n1 and a second refractive layer n2. For reference, the first refractive layer n1 may be formed of titanium oxide ($TiO_2$), and the second refractive layer n2 may be formed of hydrogen-doped amorphous silicon (a-Si:H). In addition, an outer layer n0 may indicate, for example, air, and reference numeral 310 may correspond to the variable interlayer. However, the materials of the outer layer n0, the first refractive layer n1, and the second refractive layer n2 are not limited to the above-described materials.

As can be seen from FIGS. 4A and 4B, in the nano-post having the single-layered structure, light may be refracted at a first interface between the outer layer n0 and the first refractive layer n1, and then, be incident to the variable interlayer 310. At the first interface, $\theta_0$ indicates a first incident angle, and $\theta_1$ indicates a first refraction angle. In addition, the incident angle $\theta_{in}$ to the variable interlayer 310 may be substantially the same as the first refraction angle $\theta_1$. The first refraction angle $\theta_1$ may be less than the incident angle $\theta_{in}$.

In contrast, in the nano-post NP having the double-layered structure, light may be refracted at the first interface between the outer layer n0 and the first refractive layer n1, be refracted again at a second interface between the first refractive layer n1, and the second refractive layer n2, and then be incident on the variable interlayer 310. At the second interface, $\theta_1$ indicates a second incident angle, and $\theta_2$ corresponds to a second refraction angle. In addition, the incident angle $\theta_{in}$ to the variable interlayer 310 may be substantially the same as the second refraction angle $\theta_2$. The second refraction angle $\theta_2$ may be less than the first refraction angle $\theta_1$. Accordingly, the incident angle $\theta_{in}$ to the variable interlayer 310 of the single-layered nano-post may be greater than the incident angle $\theta_{in}$ of the double-layered nano-post NP to the variable interlayer 310. As described above, the refraction is increased by adding the second refractive layer $n_2$ having a large refractive index, to thereby minimize the incident angle of the variable interlayer 310. Accordingly, the thickness D2 of the double-layered nano-post NP may be less than the thickness D1 of the single-layered nano-post.

In the image sensor 1000 of an example embodiment, the pixel array 1100 may include a variable interlayer device 300 for varying the optical length OL. The variable interlayer device 300 may include a variable interlayer 310 and a variable driver 330 that drives the variable interlayer 310. The variable driver 330 may include a structure connected to the variable interlayer 310 in various forms and/or a variable signal application circuit to adjust the optical length OL.

The variable driver 330 may be controlled by the processor 1040. The processor 1040, for example, may control the variable driver 330 to form a required optical length OL. In addition, the processor 1040 may control the variable driver 330 to form a plurality of different optical lengths OL. The optical length OL that is set when a signal is acquired by the photodetector 100, may be used when the processor 1040 processes the signal.

The variable driver 330 may vary the refractive index of the variable interlayer 310 disposed between the photodetector 100 and the color separation lens layer 200. In addition, the variable driver 330 may vary the physical distance S between the photodetector 100 and the color separation lens layer 200. In the variable interlayer 310 and various types of structures connected to the variable interlayer 310, elements between the color separation lens layer 200 and the photodetector 100 may be formed of a light-transmitting material.

Herein, components of the pixel array 1100 will be described in more detail with reference to FIGS. 5A to 5D.

Figure 5A:
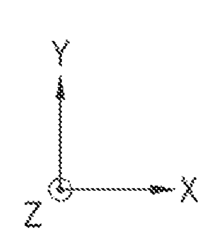
FIGS. 5A and 5B are plan views illustrating an arrangement of pixels and an arrangement of photodetection cells corresponding to a pixel area in the image sensor of FIG. 1.
Figure 5B:
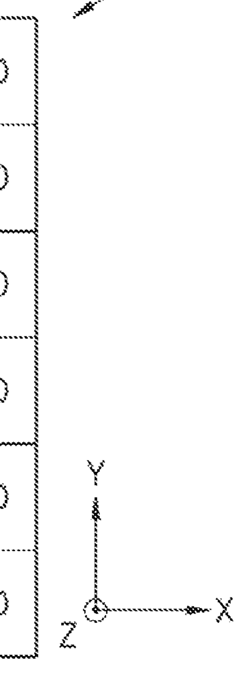
Figure 5C:
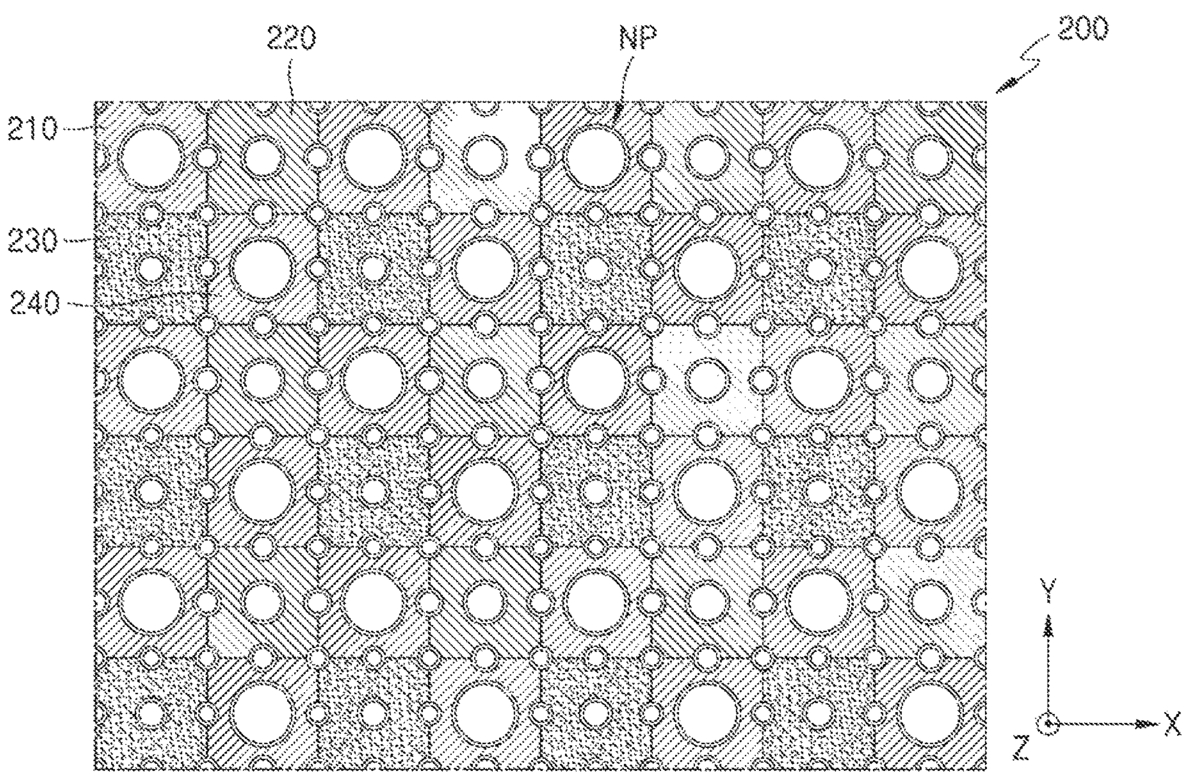
FIG. 5C is a plan view illustrating an arrangement of nano-posts in the color separation lens layer of the image sensor of FIG. 1.
Figure 5D:
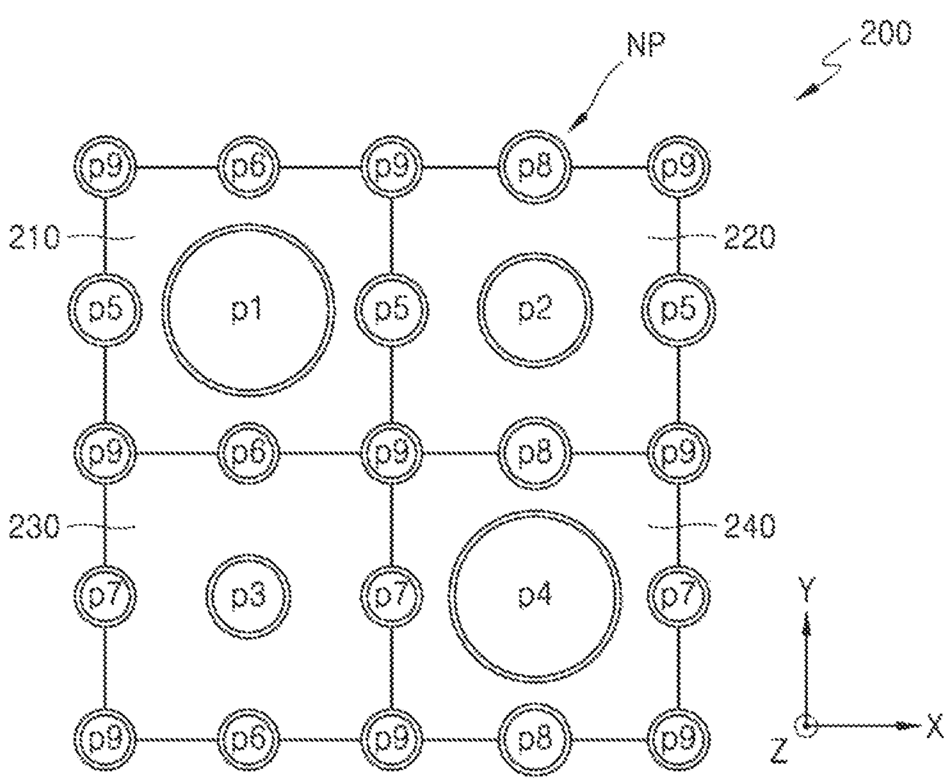
FIG. 5D is an enlarged plan view illustrating a partial area of FIG. 5C.

FIGS. 5A and 5B are plan views illustrating an arrangement of pixels and an arrangement of photodetection cells corresponding to a pixel area in the image sensor of FIG. 1, FIG. 5C is a plan view illustrating an arrangement of the nano-posts in the color separation lens layer of the image sensor of FIG. 1, and FIG. 5D is an enlarged plan view illustrating a partial area of FIG. 5C. The following descriptions are given together with reference to FIGS. 1 and 3, and redundant descriptions already given with reference to FIGS. 1 to 4B are briefly given or omitted.

Referring to FIGS. 5A to 5D, the pixel array 1100 may include a photodetector 100 and a color separation lens layer 200. The photodetector 100 may include a plurality of photodetection cells for sensing light. The color separation lens layer 200 may be positioned over an upper portion of the photodetector 100 and be spaced apart from the photodetector 100 by a predefined distance.

The photodetector 100 may include a first photodetection cell 110, a second photodetection cell 120, a third photodetection cell 130 and a fourth photodetection cell 140, each of which converts light into an electrical signal. The first photodetection cell 110 and the second photodetection cell

120 may be alternately positioned in the first direction (X direction) as shown in FIGS. 3 and 5B. In addition, the third photodetection cell 130 and the fourth photodetection cell 140 may be alternately positioned in the first direction (X direction). In addition, the first photodetection cell 110 and the third photodetection cell 130 may be alternately positioned in the second direction (Y direction), and further, the second photodetection cell 120 and the fourth photodetection cell 140 may be alternately positioned in the second direction (Y direction). The area division may be for sensing incident light individually by the pixel.

For example, the first photodetection cell 110 and the fourth photodetection cell 140 may detect light of a first spectrum corresponding to a first pixel P1, and the second photodetection cell 120 may detect light of a second spectrum corresponding to a second pixel P2. The third photodetection cell 130 may detect light of a third spectrum corresponding to the third pixel P3. For example, the light of the first spectrum may be green light, the light of the second spectrum may be blue light, and the light of the third spectrum may be red light. However, the light of each of first to third spectrums is not limited those described above.

In the image sensor 1000 of an example embodiment, because the optical distance between the photodetector 100 and the color separation lens layer 200 may vary, each of the first spectrum, the second spectrum, and the third spectrum may be a mixed form of green light, red light, and blue light in respective ratios different from each other. In addition, the ratios may vary depending on the optical distance. A cell separation layer for separating the photodetection cells from each other may be formed at the boundary between the photodetection cells.

The color separation lens layer 200 may include a plurality of nano-posts NP arranged according to a predefined rule. Herein, the rule may be applied to parameters, such as a shape, a size (width, height), a gap space, and an arrangement of the nano-posts NP. These parameters may be determined according to the target phase distribution that the color separation lens layer 200 intends to implement with respect to the incident light. The target phase distribution may include a phase distribution at a position immediately after the incident light passes through the color separation lens layer 200.

The nano-post NP may include at least any one of crystalline silicon (c-Si), polysilicon (p-Si), amorphous silicon (a-Si), and III-V group compound semiconductors (GaP, GaN, GaAs, etc.), silicon carbide (SiC), titanium oxide ($TiO_2$). For example, in the image sensor 1000 of an example embodiment, the nano-post NP may include the first refractive layer 201 and the second refractive layer 203. In addition, the first refractive layer 201 may include titanium oxide ($TiO_2$), and the second refractive layer 203 may include hydrogen-doped amorphous silicon (a-Si:H).

The nano-post NP may have sub-wavelength geometric dimensions. The sub-wavelength indicates a value smaller than the wavelength of incident light, that is, light for forming a required phase distribution. That is, at least one of the dimensions defining the shape of the nano-post NP may include a sub-wavelength. For example, in the image sensor 1000 of an example embodiment, the nano-post NP may have a cylindrical shape, and the height and diameter of the cylinder may be about 200 nm. However, the dimensions of the nano-post NP are not limited to those described above.

As can be seen from FIG. 3, the nano-posts NP may be supported by the variable interlayer 310 disposed between the photodetector 100 and the nano-posts NP. For example, the variable interlayer 310 may include any one of glass (fused silica, BK7, etc.), quartz, polymer (PMMA, SU-8, etc.), and plastic. The material of the variable interlayer 310 may have a refractive index lower than that of the material constituting the nano-posts NP. In some example embodiments, the variable interlayer 310 may include air, and in that case, an additional layer for supporting the nano-posts NP may be further provided with the variable interlayer 310. In addition, a protective layer for protecting the plurality of nano-posts NP may be provided. The protective layer may include a material having a refractive index lower than that of the nano-posts NP.

The nano-posts NP having a refractive index different from that of the surrounding material may change the phase of light passing through the nano-posts NP. This may result from a phase delay caused by the shape dimension of the sub-wavelength of the nano-post NP. Specific configurations of the phase delay may be determined by a detailed shape dimension, an arrangement shape, and the like of the nano-posts NP. The color separation lens layer 200 may control the degree of phase delay occurring in each of the plurality of nano-posts NP, to implement the phase distribution required for incident light.

That is, the shape, size, and arrangement of the plurality of nano-posts NP may be determined to form an appropriate phase distribution. By forming such a phase distribution, the plurality of nano-posts NP may focus light of different spectra to the first photodetection cell 110 and the second photodetection cell 120 adjacent to each other. In addition, by forming such a phase distribution, the plurality of nano-posts NP may focus light of different spectra to the third photodetection cell 130 and the fourth photodetection cell 140 adjacent to each other.

Referring to FIG. 5B and FIG. 5C, the color separation lens layer 200 may correspond to a plurality of photodetection cells 110, 120, 130, 140 by one to one, and may include a plurality of areas 210, 220, 230 and 240 facing each other. One or more nano-posts NP may be arranged in each of the plurality of first to fourth areas 210, 220, 230, and 240. At least one of a shape, a size, and an arrangement of the plurality of nano-posts NP may vary depending on the area.

As can be seen from FIGS. 3 and 5C, the first area 210 and the first photodetection cell 110 may be disposed correspondently to each other, and the second area 220 and the second photodetection cell 120 may be disposed correspondently to each other. In addition, the third area 230 and the third photodetection cell 130 may be disposed correspondently to each other, and the fourth area 240 and the fourth photodetection cell 140 may be disposed correspondently to each other.

The color separation lens layer 200 may include a plurality of unit pattern arrays arranged in two dimensions. Each unit pattern array may include four areas arranged in a 2×2 matrix shape, for example, a first area 210, a second area 220, a third area 230, and a fourth area 240.

In FIGS. 5B and 5C, it is illustrated that the plurality of areas 210, 220, 230, and 240 and the plurality of first to fourth photodetection cells 110, 120, 130, and 140 have the same size and face each other in the vertical direction. However, the configurations of the photodetection cells and the areas are illustrative and not limited to those described above. For example, a plurality of areas defined in different shapes may correspond to a plurality of photodetection cells. This also applies to other example embodiments below.

The color separation lens layer 200 may be divided into areas in such a configuration that light of a first spectrum is branched and focused on the first photodetection cell 110 and the fourth photodetection cell 140, light of a second spectrum is branched and focused on the second photodetection cell 120, and light of a third spectrum is branched and focused on the third photodetection cell 130. In addition, for the configurations described above, the size, shape, and arrangement of the nano-posts NP may be determined by the area.

As illustrated in FIG. 5A, the pixel arrangement of the pixel array 1100 may be similar to that of a Bayer pattern. A single unit pixel may include four quadrant regions. For example, the quadrant region may be allocated to two first pixels P1, one second pixel P2, and one third pixel P3. A plurality of unit pixels may be repeatedly arranged in two dimensions in the first direction (X direction) and the second direction (Y direction).

In the 2×2 matrix-shaped unit pixel, a pair of the first pixels P1 may be arranged in one diagonal direction, and the second pixel P2 and the third pixel P3 may be arranged in the other diagonal direction. Overviewing the pixels of the pixel array 1100, a first row and a second row may be repeatedly arranged in the second direction (Y direction) in such a configuration that the first pixel P1 and the second pixel P2 may be alternately arranged in the first row along the first direction (X direction) and the third pixel P3 and the first pixel P1 may be alternately arranged in the second row along the first direction (X direction). The colors of the first pixel P1, the second pixel P2, and the third pixel P3 are not fixed to a single color, respectively, and may vary depending on the optical length OL between the photodetector 100 and the color separation lens layer 200. A color or wavelength distribution of the first pixel P1, the second pixel P2, and the third pixel P3 may be expressed as a first spectrum, a second spectrum, and a third spectrum, respectively. In addition, the first spectrum, the second spectrum, and the third spectrum may have the wavelength distribution shapes different from one another according to the optical length OL.

Referring to FIG. 5B, first photodetection cells 110, second photodetection cells 120, third photodetection cells 130 and fourth photodetection cells 140 may be arranged into a 2×2 matrix shape in the first direction X and the second direction Y in such a configuration that a row in which the first photodetection cell 110 and the second photodetection cell 120 may be repeatedly arranged in the first direction X and another row in which the third photodetection cell 130 and the fourth photodetection cell 140 may be repeatedly arranged in the first direction X are repeatedly arranged in the second direction Y. Accordingly, the first photodetection cell 110 or the fourth photodetection cell 140 may correspond to the first pixel P1, the second photodetection cell 120 may correspond to the second pixel P2, and the third photodetection cell 130 may correspond to the third pixel P3.

Referring to FIGS. 5B and 5C together, the first photodetection cell 110 and the first area 210 may correspond to the first pixel P1, and the fourth photodetection cell 140 and the fourth area 240 may correspond to another first pixel P1. In addition, the second photodetection cell 120 and the second area 220 may correspond to the second pixel P2, and the third photodetection cell 130 and the third area 230 may correspond to the third pixel P3.

In addition, as illustrated in FIG. 5C, a plurality of the nano-posts NP having different cross-sectional sizes may be arranged at central portions of the first pixel P1, the second pixel P2, and the third pixel P3, at central portions of pixel boundary lines between neighboring pixels, and cross points of the pixel boundary lines. The cross-sectional size of the nano-posts NP may be smaller at the pixel boundary lines than at the central portions of the pixels.

FIG. 5D illustrates an arrangement of the nano-posts NP in the first to fourth areas 210, 220, 230 and 240 of the unit pattern array, which is a portion of the pixel array in FIG. 5C. Thus, in FIG. 5D, the nano-posts NP in the unit pattern array are designated to p1 to p9 according to their detailed positions in the unit pattern array.

Describing in more detail with reference to FIG. 5D, among the nano-posts NP in the unit pattern array, the nano-post NP in the central portion of the first area 210, designated as p1 and the nano-post NP in the central portion of the fourth area 240, designated as p4, may have cross-sectional sizes larger than the nano-post NP in the central portion of the second area 220, designated as p2, or the nano-post NP in the central portion of the third area 230, designated as p3. In addition, the nano-post p2 in the central portion of the second area 220 may have a cross-sectional size larger than the nano-post p3 in the central portion of the third area 230. However, these are provided as examples, and the nano-posts NP may be modified into various shapes, sizes, according to example embodiments. Herein, the cross-sectional size indicates a size of the cross-sectional area perpendicular to the third direction (Z direction) of the nano-posts NP.

The nano-posts NP provided in the first and fourth areas 210 and 240 corresponding to the first pixel P1 have different distribution rules in the first direction (X direction) and the second direction (Y direction). For example, the nano-posts NP in the first and fourth areas 210 and 240 may be arranged in such a configuration that the size of the nano-posts NP in the first direction (X direction) is different from that of the nano-posts NP in the second direction (Y direction). That is, as shown in FIG. 5D, among the nano-posts NP in the unit pattern array, the nano-post NP arranged at the boundary line between the first area 210 and the second area 220 in the first direction X, designated as p5, may have a cross-sectional area different from that of the nano-post NP arranged at the boundary line between the first area 210 and the third area 230 in the second direction Y, designated as p6. Similarly, the nano-post NP arranged at the boundary line between the fourth area 240 and the third area 230 in the first direction X, designated as p7, may have a cross-sectional area different from that of the nano-post NP arranged at the boundary line between the fourth area 240 and the second area 220 in the second direction Y, designated as p8.

In contrast, the nano-posts NP in the second area 220 corresponding to the second pixel P2 and the third area 230 corresponding to the third pixel P3 may have a distribution rule symmetric with respect to the first direction (X direction) and the second direction (Y direction). That is, as illustrated in FIG. 5D, among the nano-posts NP in the unit pattern array, the nano-posts NP arranged at the boundary lines of the second area 220 in the first direction (X direction), designated as p5, may have the same cross-sectional area as that of the nano-posts NP arranged at the boundary lines of the second area 220 in the second direction (Y direction), designated as p8, and the nano-posts NP arranged at the boundary lines of the third area 230 in the first direction (X direction), designated as p7, may have the same cross-sectional area as that of the nano-posts NP arranged at the boundary lines of the third area 230 in the second direction (Y direction), designated as p6.

In addition, the nano-posts NP (designated as p9) arranged at the cross points of the boundary lines of the first area 210, second area 220, third area 230, and fourth area 240, which are the intersection points of the four areas, may have the same cross-sectional areas. These distributions are caused by the pixel arrangement similar to a Bayer pattern. While the second pixel P2 and the third pixel P3 may be adjacent to the same first pixel P1 in both of the first direction (X direction) and the second direction (Y direction), the first pixel P1 corresponding to the first area 210 may be adjacent to the second pixel P2 in the first direction (X direction) and to the third pixel p3 in the second direction (Y direction) different from the second pixel P2, and the first pixel P1 corresponding to the fourth area 240 may be adjacent to the third pixel P3 in the first direction (X direction) and to the second pixel p2 in the second direction (Y direction) different from the third pixel P3. In addition, the first pixel P1 corresponding to the first area 210 and the fourth area 240 may be adjacent to other first pixels P1 in the four diagonal directions, the second pixel P2 corresponding to the second area 220 may be adjacent to other third pixels P3 in the four diagonal directions, and the third pixel P3 corresponding to the third area 230 may be adjacent to other second pixels P2 in the four diagonal directions.

Accordingly, in the second area 220 and the third area 230 corresponding to the second pixel P2 and the third pixel P3, respectively, the nano-posts NP may be arranged in the form of 4-fold symmetry, and the nano-posts NP may be arranged in the form of 2-fold symmetry in the first area 210 and the fourth area 240 corresponding to the first pixel P1. Particularly, the first area 210 and the fourth area 240 may be rotated by 90° with respect to each other.

All the nano-posts NP are illustrated as having a symmetrical circular cross-sectional shape, but are not limited thereto. For example, some nano-posts NP having an asymmetric cross-sectional shape may be included. For example, in the first area 210 and the fourth area 240 corresponding to the first pixel P1, the nano-post NP may be provided as an asymmetric cross-sectional shape in which a width of the nano-post NP in the first direction (X direction) is different from that of the nano-post NP in the second direction (Y direction), and in the second area 220 and the third area 230 corresponding to the second pixel P2 and the third pixel P3, respectively, the nano-post NP may be provided as a symmetric cross-sectional shape in which a width of the nano-post NP in the first direction (X direction) is the same as that of the nano-post NP in the second direction (Y direction).

The arrangement rules of the color separation lens layer 200 may implement an example of the target phase distribution at a position which the light reaches immediately after passing through the color separation lens layer 200 in such a way that light of the first spectrum is branched and focused onto the first photodetection cell 110 and the fourth photodetection cell 140, light of the second spectrum is branched and focused onto the second photodetection cell 120, and light of the third spectrum is branched and focused onto the third photodetection cell 130. However, the arrangement rules of the color separation lens layer 200 is not limited to those described above.

The shapes, sizes, and arrangements of the nano-posts NP, which are arranged at various areas of the color separation lens layer 200, may be configured to form such a phase that the light of the first spectrum has the phase by which the light of the first spectrum is focused onto the first photodetection cell 110 and the fourth photodetection cell 140 without travelling to the second photodetection cell 120 and the third photodetection cell 130 adjacent to the first photodetection cell 110 and the fourth photodetection cell 140 at a position where the light of the first spectrum immediately passes through the color separation lens layer 200.

In the same way, the shapes, sizes, and arrangements of the nano-posts NP, which are arranged at various areas of the color separation lens layer 200, may be configured to form such a phase that the light of the second spectrum has the phase by which the light of the second spectrum is focused onto the second photodetection cell 120 without travelling to the first photodetection cell 110, the third photodetection cell 130 and the fourth photodetection cell 140 adjacent to the second photodetection cell 120 at a position where the light of the second spectrum immediately passes through the color separation lens layer 200.

In addition, in the same way, the shapes, sizes, and arrangements of the nano-posts NP, which are arranged at various areas of the color separation lens layer 200, may be configured to form such a phase that the light of the third spectrum has the phase by which the light of the third spectrum is focused onto the third photodetection cell 130 without travelling to the first photodetection cell 110, the second photodetection cell 120, and the fourth photodetection cell 140 adjacent to the third photodetection cell 130 at a position where the light of the third spectrum immediately passes through the color separation lens layer 200.

In the image sensor 1000 of an example embodiment, the optical distance between the photodetector 100 and the color separation lens layer 200 may vary in the pixel array 1100. Accordingly, the light branching by the wavelength caused by the shape, size, and arrangement of the nano-posts NP corresponds to the descriptions assuming an optical distance under predefined conditions. The shapes, sizes, and/or arrangements of the nano-posts NP may be determined to satisfy all of the predefined conditions, and the color separation lens layer 200 may control the light to have the following target phase distributions immediately after passing through the color separation lens layer 200. That is, at a position which the light reaches immediately after passing through the color separation lens layer 200, i.e., on a bottom surface of the color separation lens layer 200 and a top surface of the variable interlayer 310, the phase of the light of the first spectrum may be $2N\pi$ at the central portion of the first area 210 corresponding to the first photodetection cell 110 and at the central portion of the fourth area 240 corresponding to the fourth photodetection cell 140. In addition, the phase of the light of the first spectrum may be $(2N-1)\pi$ at the central portion of the second area 220 corresponding to the second photodetection cell 120 and at the central portion of the third area 230 corresponding to the third photodetection cell 130. Herein, the capital letter N denotes an integer greater than 0. In this regard, at the position which the light reaches immediately after passing through the color separation lens layer 200, the phase of the light of the first spectrum may be maximized at the central portions of the first area 210 and the fourth area 240, and may decrease gradually in a concentric circle shape as the distance from the central portions of the first area 210 and the fourth area 240 increases, until the phase of the light of the first spectrum may be minimized at the central portions of the second area 220 and the third area 230. Particularly, for example, in case that N equals one (N=1), at the position which the light reaches immediately after passing through the color separation lens layer 200, the phase of the light of the first spectrum may be about $2\pi$ at the central portions of the first area 210 and the fourth area 240, and be about $\pi$ at the central portions of the second area 220 and the third area 230. Herein, the phase may denote a relative phase value with respect to a phase immediately before light passes through the nano-post NP.

In addition, at the position which the light reaches immediately after passing through the color separation lens layer 200, the phase of the light of the second spectrum may be 2Mπ at the central portion of the second area 220 corresponding to the second photodetection cell 120, and may be (2M−1)π at the central portion of the first area 210 corresponding to the first photodetection cell 110 and at the central portion of the fourth area 240 corresponding to the fourth photodetection cell 140. In addition, the phase of the light of the second spectrum may be larger than (2M−2)π and smaller than (2M−1)π at the central portion of the third area 230 corresponding to the third photodetection cell 130. Herein, the capital letter M denotes an integer greater than 0. In this regard, at the position which the light reaches immediately after passing through the color separation lens layer 200, the phase of the light of the second spectrum may be maximized at the central portion of the second area 220, and may decrease gradually in a concentric circle shape as the distance from the central portion of the second area 220 increases, until the phase of the light of the second spectrum may be minimized at the central portions of the first area 210, the third area 230, and the fourth area 240. Particularly, for example, in case that M equals one (M=1), at the position which the light reaches immediately after passing through the color separation lens layer 200, the phase of the light of the second spectrum may be about 2π at the central portion of the second area 220, about π at the central portions of the first area 210 and the fourth area 240, and be about 0.2π to about 0.7π at the central portion of the third area 230.

In addition, in the same way, at the position which the light reaches immediately after passing through the color separation lens layer 200, the phase of the light of the third spectrum may be 2Lπ at the central portion of the third area 230 corresponding to the third photodetection cell 130, be (2L−1)π at the central portions of the first area 210 corresponding to the first photodetection cell 110 and the fourth area 240 corresponding to the fourth photodetection cell 140, and be larger than (2L−2)π and smaller than (2L−1)π at the central portion of the second area 220 corresponding to the second photodetection cell 120. Herein, the capital letter L denotes an integer greater than 0. In this regard, at the position which the light reaches immediately after passing through the color separation lens layer 200, the phase of the light of the third spectrum may be maximized at the central portion of the third area 230, and may decrease gradually in a concentric circle shape as the distance from the central portion of the third area 230 increases, until the phase of the light of the third spectrum may be minimized at the central portions of the first area 210, the second area 220, and the fourth area 240. Particularly, for example, in case that L equals one (L=1), at the position which the light reaches immediately after passing through the color separation lens layer 200, the phase of the light of the third spectrum may be about 2π at the central portion of the third area 230, be about it at the central portions of the first area 210 and the fourth area 240, and be about 0.2π to about 0.7π at the central portion of the second area 220.

The light of the first spectrum, the light of the second spectrum, and the light of the third spectrum may be green light, blue light, and red light, respectively. However, the colors of the light of the first spectrum, the light of the second spectrum, and the light of the third spectrum are not limited to those above described. As mentioned above, the target phase distribution may indicate the phase distribution at the position which the light reaches immediately after passing through the color separation lens layer 200. In addition, when the light of such a phase distribution travels toward a plurality of photodetection cells 110, 120, 130, and 140, the spectrum of the light may be formed into another spectrum having a wavelength that is variable according to a traveling distance of the light. That is, the light having a different wavelength spectrum may be focused onto the photodetection cells 110, 120, 130, and 140 by adjusting the optical length OL to the photodetector 100.

FIGS. 6A to 6D are cross-sectional views of a pixel array structure in image sensors according to example embodiments, specifically illustrating various example embodiments of variable interlayer devices. The same descriptions as are given with reference to FIGS. 1 to 5D are briefly given or omitted.

Figure 6A:
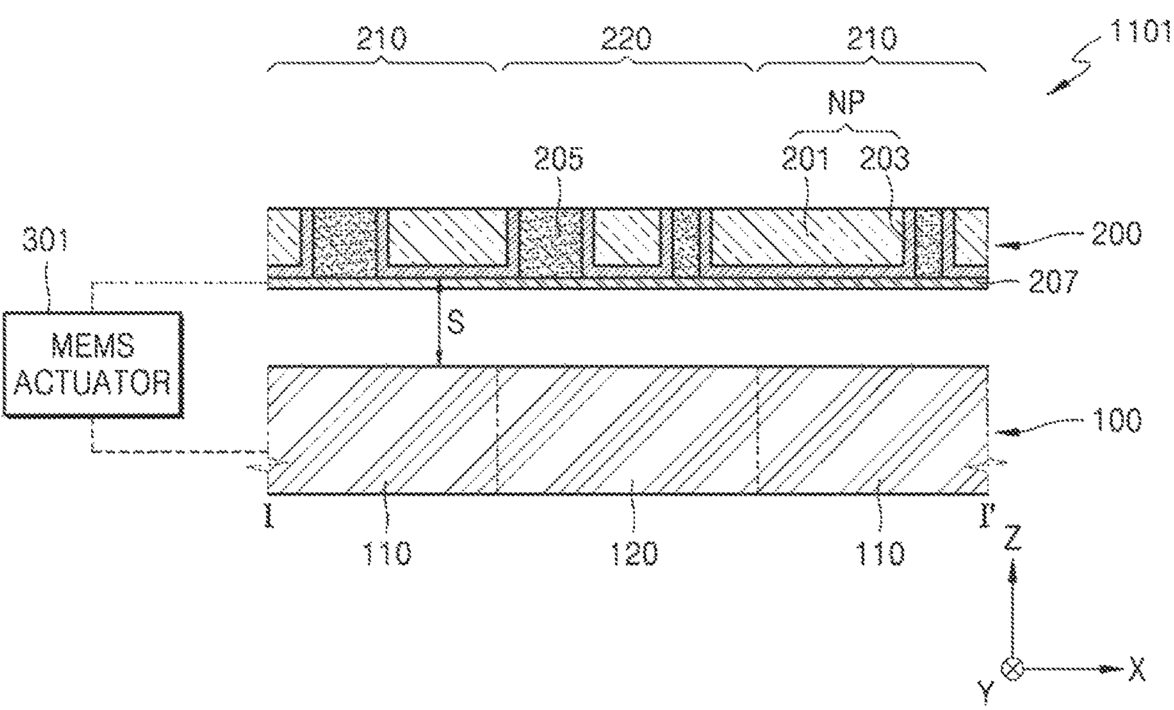
FIGS. 6A, 6B, 6C and 6D are cross-sectional views of a pixel array structure in image sensors, according to example embodiments, illustrating various example embodiments of variable interlayer devices.

Referring to FIG. 6A, in the image sensor 1000 according to an example embodiment, the pixel array 1101 may include a photodetector 100, a color separation lens layer 200, and a variable interlayer device 301. The variable interlayer device 301 may be configured as, or may include, a micro electromechanical system (MEMS) actuator for varying the physical distance S between the color separation lens layer 200 and the photodetector 100. The medium between the color separation lens layer 200 and the photodetector 100 may be, for example, air. Accordingly, a support layer 207 for supporting the nano-posts NP may be additionally provided.

The support layer 207 and the photodetector 100 may be electromechanically connected to the variable interlayer device 301, so that the position of the support layer 207 may vary with respect to the photodetector 100 according to the driving of the variable interlayer device 301. Accordingly, the physical distance S between the color separation lens layer 200 and the photodetector 100 may be controlled.

Figure 6B:
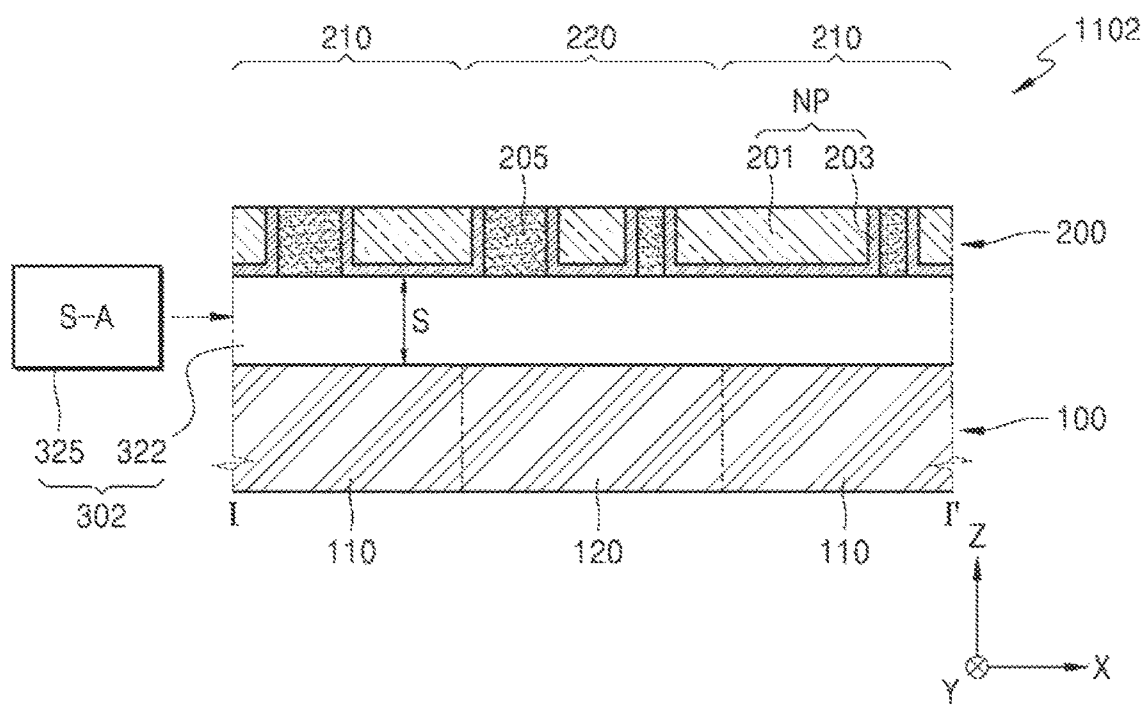

Referring to FIG. 6B, in the image sensor 1000 of an example embodiment, the pixel array 1102 may include a photodetector 100, a color separation lens layer 200, and a variable interlayer device 302. The variable interlayer device 302 may include a shape-variable structure 322 and a signal control circuit 325 for varying the physical distance S between the color separation lens layer 200 and the photodetector 100.

The shape-variable structure 322 may include a shape-variable material of which the shape is changed according to an electrical signal. In addition, the signal control circuit 325 may apply an electric signal to the shape-variable structure 322. The shape-variable material of the shape-variable structure 322 may vary according to a signal applied from the signal control circuit 325, so that the physical distance S between the photodetector 100 and the color separation lens layer 200 may vary.

The shape-variable material of the shape-variable structure 322 may be, for example, a shape memory alloy (SMA) or an electro-active polymer. The shape-variable structure 322 may be embodied in various forms. For example, the shape-variable structure 322 may have various configurations in which a shape-variable material layer and a fixing member for supporting the shape-variable material layer are combined. However, the configurations of the shape-variable structure 322 are not limited to those described above. For example, the shape-variable structure 322 may be entirely formed of the shape-variable material layer.

Figure 6C:
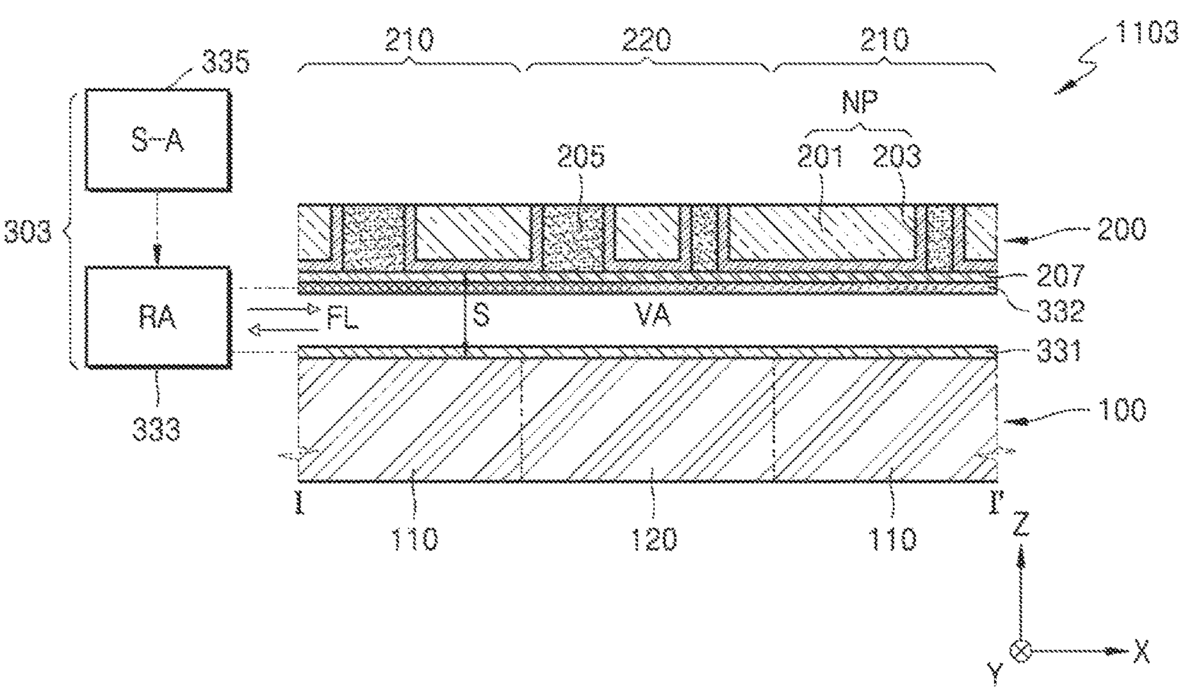

Referring to FIG. 6C, in the image sensor 1000 of an example embodiment, the pixel array 1103 may include a photodetector 100, a color separation lens layer 200, and a variable interlayer device 303. The variable interlayer device 303 may include a reservoir 333, a frame structure, and a signal control circuit 335. A height variable area VA may be provided with the frame structure. The signal control circuit 335 may apply a signal to control the optical fluid FL in the reservoir 333 to flow to the height variable area VA of the frame structure, and to control the optical fluid FL to flow from the height variable area VA to the reservoir 333.

The height variable area VA may indicate a space between the color separation lens layer 200 and the photodetector 100. A stretchable membrane 332 and a fixing member 331 may be provided in the height variable area VA. The fixing member 331 may support elastic deformation of the stretchable membrane 332. The stretchable membrane 332, the fixing member 331, the reservoir 333, and the height variable area VA may constitute the frame structure.

The signal control circuit 335 may apply a hydraulic signal to the reservoir 333 to move the optical fluid FL to the height variable area VA. In addition, an additional component, such as an electrode for fluid flow, may be further provided in the reservoir 333 or the height variable area VA, and the signal control circuit 535 may apply an electric signal to the additional component, to thereby make the optical fluid FL flow.

When the optical fluid FL flows between the reservoir 333 and the height variable area VA, the stretchable membrane 332 of the height variable region VA may be stretched and contracted according to the amount of the optical fluid FL, and thus, the height of the height variable area VA may be adjusted. As the height of the variable height area VA is adjusted, the physical distance S between the color separation lens layer 200 and the photodetector 100 may be adjusted. In FIG. 6C, the support layer 207 for supporting the nano-posts NP is illustrated as an example, however, the pixel array 1103 is not limited to the support layer 207. For example, the support layer 207 may be omitted, and the nano-posts NP may be directly supported by the stretchable membrane 332.

Figure 6D:
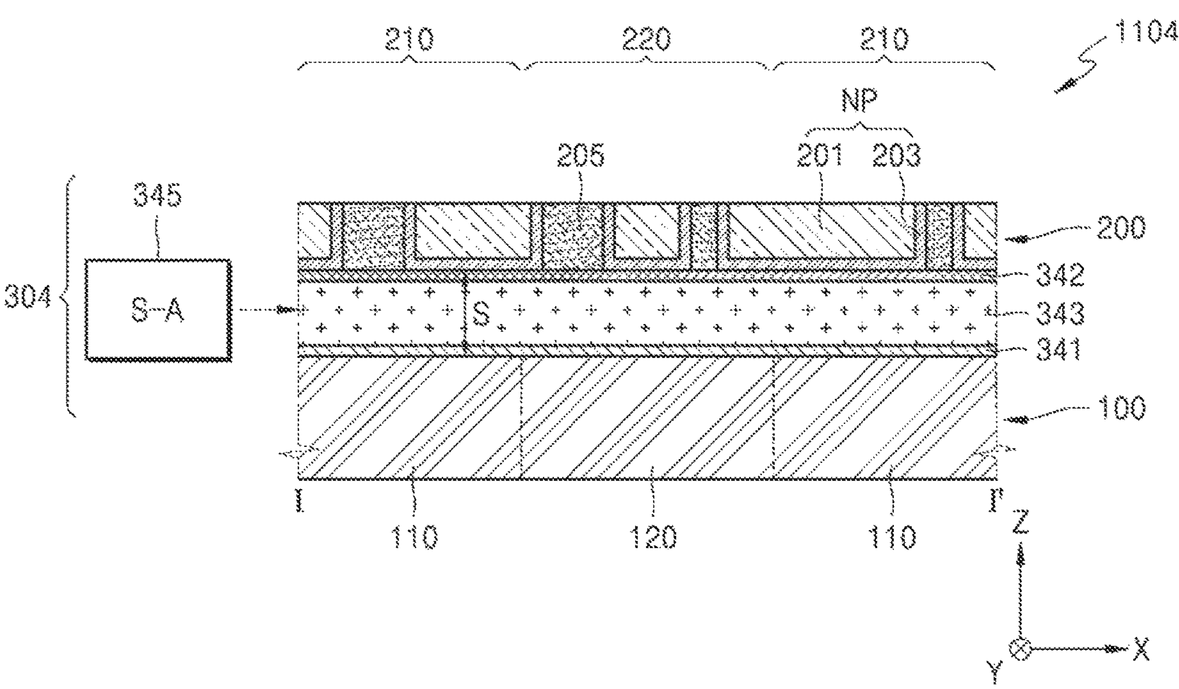

Referring to FIG. 6D, in the image sensor 1000 of an example embodiment, the pixel array 1104 may include a photodetector 100, a color separation lens layer 200, and a variable interlayer device 304. The variable interlayer device 304 may include a refractive index variable layer 343 having a refractive index that is variable according to an externally input signal, transparent electrodes 341 and 342, and a signal control circuit 345. The transparent electrodes 341 and 342 may be respectively disposed on the upper and lower surfaces of the refractive index variable layer 343. The signal control circuit 345 may apply an electrical signal to the refractive index variable layer 343. The refractive index of the refractive index variable layer 343 may vary according to a signal applied from the signal control circuit 345, and as a result, an optical length represented as a product of the refractive index and the physical distance S may also vary.

The refractive index variable layer 343 may include a material of which the optical properties change according to an electrical signal. The refractive index variable layer 343 may include, for example, an electro-optic material in which an effective dielectric constant is changed when an electric signal is applied to change the refractive index. Examples of the electro-optic material may include lithium niobate ($LiNbO_3$), lithium tantalate ($LiTaO_3$), potassium tantalate niobate (KTN), lead zirconate titanate (PZT), liquid crystal, etc. In addition, various polymers may be used as the electro-optic material.

In addition, the refractive index variable layer 343 is not limited to an electro-optical material. Thus, a phase changeable material of which the dielectric constant is changed by heat at a predefined temperature or more. For example, the refractive index variable layer 343 may include vanadium dioxide ($VO_2$), vanadium trioxide ($V_2O_3$), copper oxide (CuO), manganese oxide (MnO), cobalt oxide (CoO), cobalt dioxide ($CoO_2$), lithium cobalt oxide ($LiCoO_2$), $Ca_2RuO_4$ or the like. In this case, a heat generating layer may be further disposed between the signal control circuit 345 and the refractive index variable layer 343. The heat generating layer may generate heat by the electrical signal of the signal control circuit 345, and may transfer the generated heat to the refractive index variable layer 343.

Figure 7:
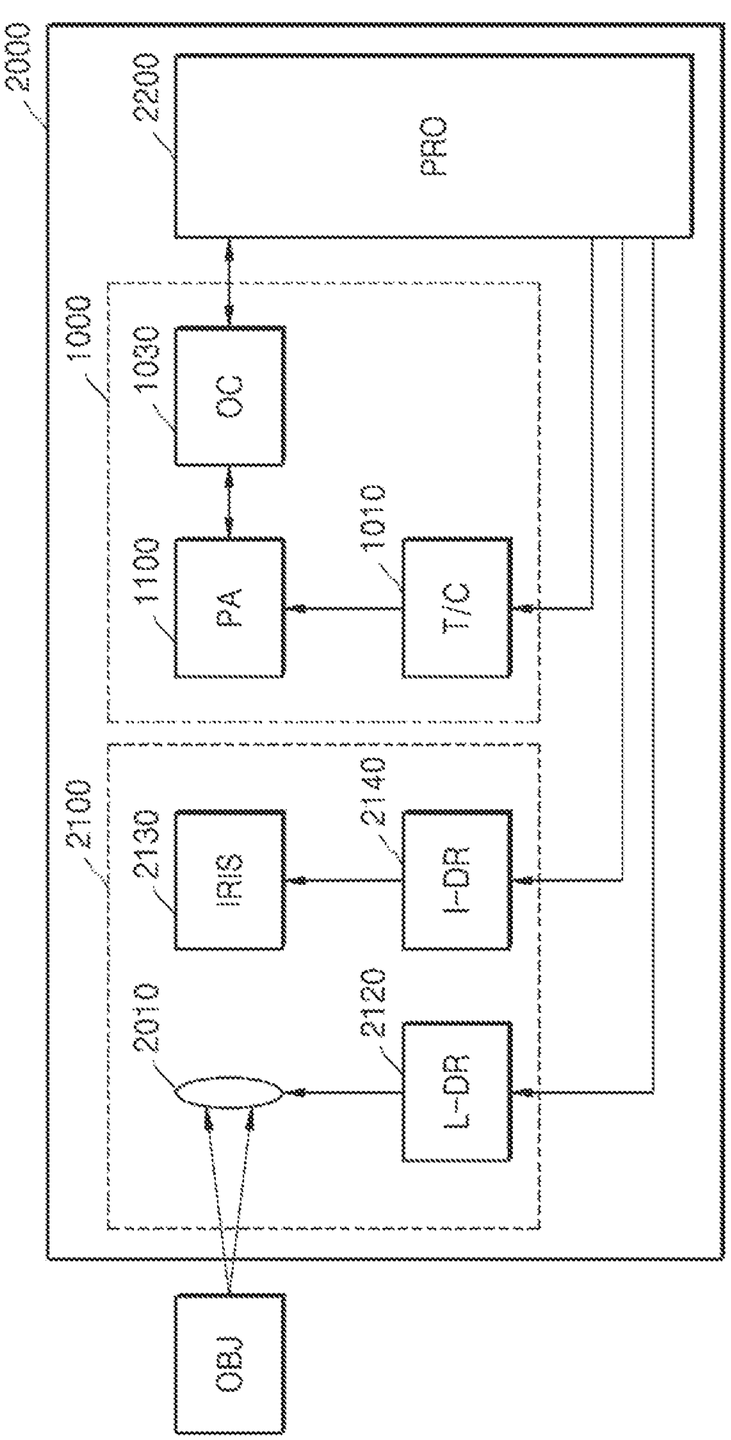
FIG. 7 is a block diagram showing a structure of an electronic device including the image sensor, according to an example embodiment.

FIG. 7 is a block diagram showing a structure of an electronic device including the image sensor according to an example embodiment. The following descriptions are given together with reference to FIG. 1, and redundant descriptions already given with reference to FIGS. 1 to 6D are briefly given or omitted.

Referring to FIG. 7, an electronic device 2000 of an example embodiment may include an imaging device 2100, an image sensor 1000, and a processor 2200. The electronic device 2000 may include, for example, a camera. The imaging device 2100 may focus the light reflected from an object OBJ to form an optical image. The imaging device 2100 may include an objective lens 2010, a lens driver 2120, an iris 2130, and an iris driver 2140. In FIG. 7, only one lens is illustrated for convenience, but according to example embodiments the objective lens 2010 may include a plurality of lenses having different sizes and shapes.

The lens driver 2120 may communicate with the processor 2200 about information on focus detection, and may control the position of the objective lens 2010 according to a control signal provided from the processor 2200. The lens driver 2120 may move the objective lens 2010 to control the distance between the objective lens 2010 and the object OBJ, or control the positions of each individual lens in the objective lens 2010. The lens driver 1120 may drive the objective lens 2010, to thereby adjust the focus on the object OBJ. The electronic device 2000 may have an auto-focusing function.

The iris driver 2140 may communicate with the processor 2200 about the information on the amount of light, and may control the iris 2130 according to a control signal provided from the processor 2200. For example, the iris driver 2140 may increase or decrease the aperture of the iris 2130 according to the amount of light entering the inside of the electronic device 2000, such as a camera, through the objective lens 2010. In addition, the iris driver 2140 may adjust the opening time of the iris 2130.

The image sensor 1000 may generate an electrical image signal based on the intensity of incident light. The image sensor 1000 may include, for example, the image sensor 1000 of FIG. 1. Accordingly, the image sensor 1000 may include a pixel array 1100, a timing controller 1010, and an output circuit 1030. In addition, the image sensor 1000 may further include a row decoder 1020. The light passing through the objective lens 2010 and the iris 2130 may form an image of the object OBJ on the light receiving surface of the pixel array 1100. The pixel array 1100 may include a CCD or CMOS image sensor for converting an optical signal into an electrical signal. The pixel array 1100 may include additional pixels for performing an AF function or a distance measurement function.

The processor 2200 may control the overall operation of the electronic device 2000 and may have an image processing function. For example, the processor 2200 may provide a control signal for the operation of each component to the lens driver 2120, the iris driver 2140, the timing controller 1010, and the like. As described above, the pixel array 1100 of the image sensor 1000 may have such a structure that the optical length OL between the photodetector 100 and the color separation lens layer 200 is adjusted. Accordingly, the electronic device 2000 of an example embodiment may generate an image by using a plurality of optical signal sets obtained at a plurality of optical lengths based on the image sensor 1000, so that images of high color purity and high reproducibility is generated by the electronic device 2000.

FIGS. 8A to 8D are cross-sectional views schematically illustrating a process of manufacturing an image sensor, according to an example embodiment. The following descriptions are given together with reference to FIGS. 2 and 3, and redundant descriptions already given with reference to FIGS. 1 to 7 are briefly given or omitted.

Figure 8A:
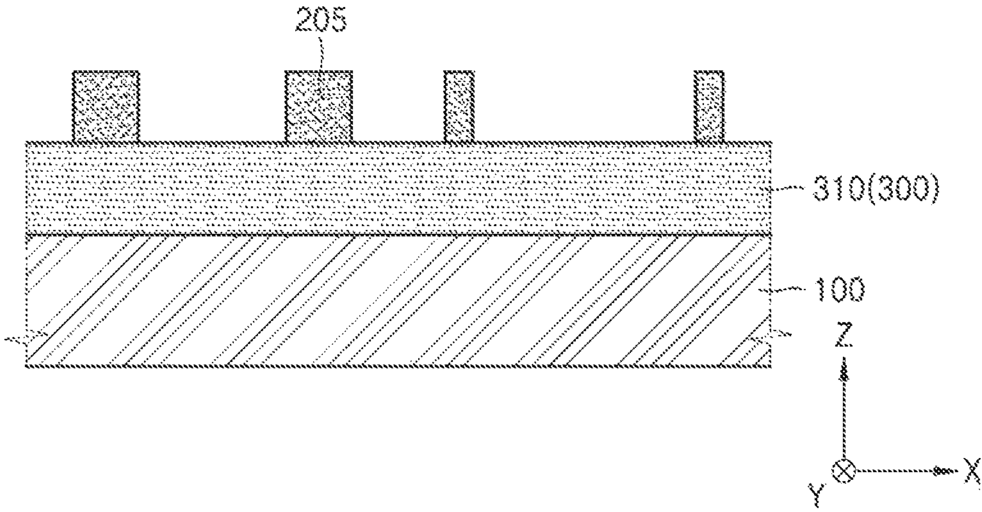
FIGS. 8A, 8B, 8C and 8D are cross-sectional views schematically illustrating a process of manufacturing an image sensor, according to an example embodiment.

Referring to FIG. 8A, the photodetector 100 and the variable interlayer 310 may be formed on a substrate. The photodetector 100 may include a plurality of photodetection cells. The variable interlayer 310 may be included in the variable interlayer device 300. The elements of the variable interlayer devices 301 to 304 of FIGS. 6A to 6D may be formed on the photodetector 100 instead of the variable interlayer 310.

A first material layer for a spacer layer may be formed on the variable interlayer 310. The first material layer may include a low refractive index material, for example, silicon oxide ($SiO_2$). However, the material for the first material layer is not limited to silicon oxide ($SiO_2$) Subsequently, a photoresist (PR) pattern may be formed on the first material layer by a photo process, and then, the first material layer may be etched by using the PR pattern as a mask, to thereby form a spacer layer 205.

Figure 8B:
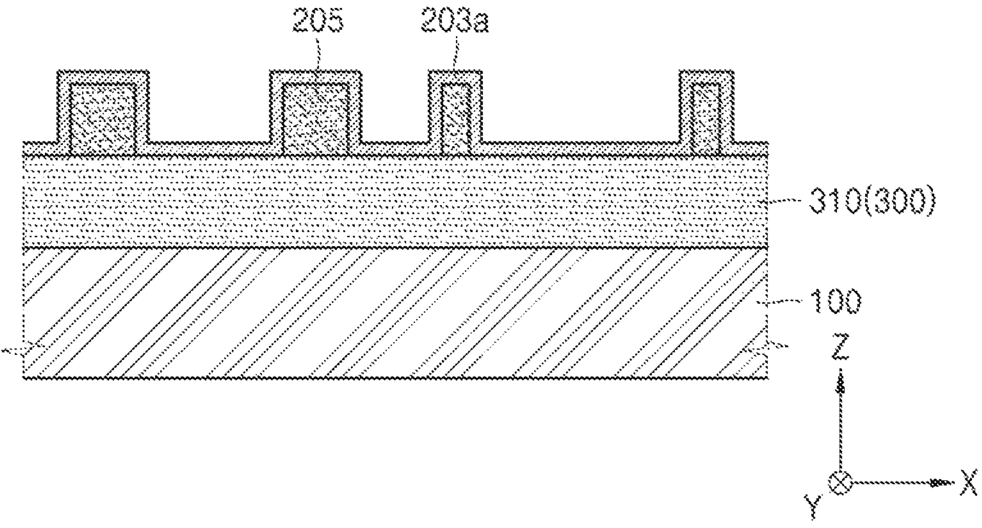

Referring to FIG. 8B, a second material layer 203*a* may be formed on the variable interlayer 310 and the spacer layer 205 in such a way that the variable interlayer 310 and the spacer layer 205 are covered with the second material layer 203*a*. The second material layer 203*a* may be formed to a thin layer by an atomic layer deposition (ALD) process. For example, the second material layer 203*a* may be formed to have a thickness of a few nanometers to a few tens of nanometers. The second material layer 203*a* may be formed of a material having excellent light transmittance and a high refractive index. For example, the second material layer 203*a* may be formed of hydrogen-doped amorphous silicon (a-Si:H). Of course, the material of the second material layer 203*a* is not limited to hydrogen-doped amorphous silicon (a-Si:H).

Figure 8C:
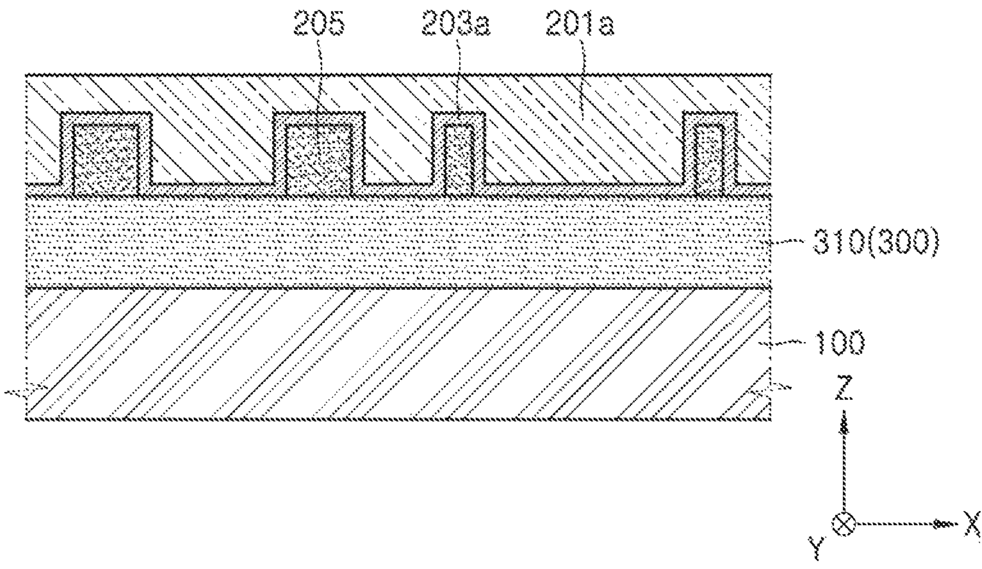

Referring to FIG. 8C, after the second material layer 203*a* is formed, a third material layer 201*a* may be formed on the second material layer 203*a* in such a way that the second material layer 203*a* is covered with the third material layer 201*a*. The third material layer 201*a* may be formed to have a relatively high thickness. For example, the third material layer 201*a* may be formed to have such a thickness that the grooves of the second material layer 203*a* caused by the neighboring spacer layers 205 are sufficiently filled. The third material layer 201*a* may be formed of a material having excellent light transmittance and a high refractive index. However, the refractive index of the third material layer 201*a* may be lower than that of the second material layer 203*a*. For example, the third material layer 201*a* may be formed of titanium oxide ($TiO_2$). Of course, the material of the third material layer 201*a* is not limited to titanium oxide ($TiO_2$).

Figure 8D:
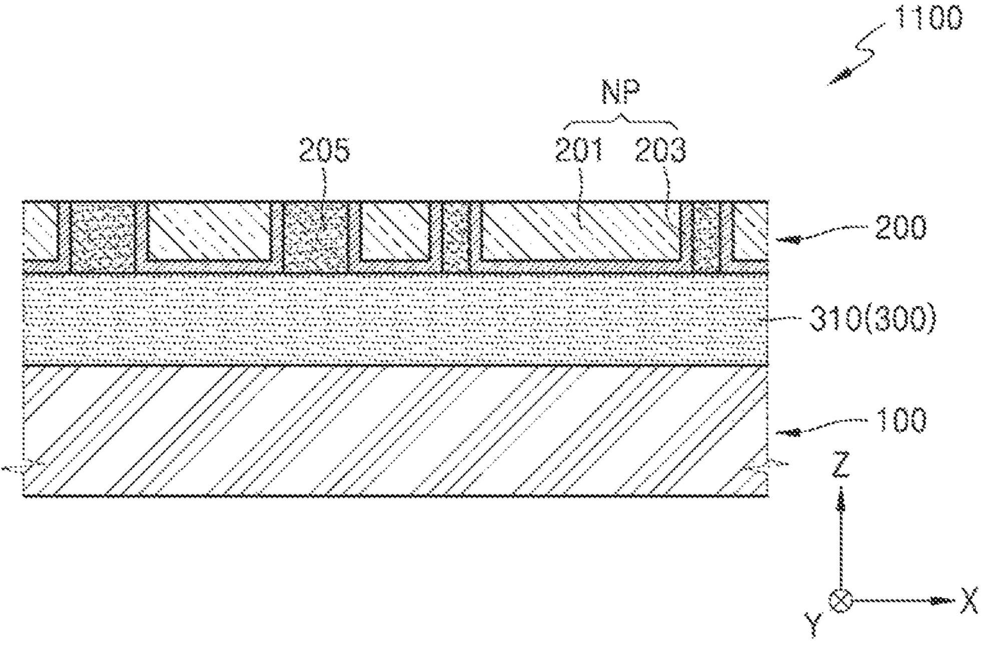

Referring to FIG. 8D, after the third material layer 201*a* is formed, the nano-posts NP are formed by a chemical mechanical planarization (CMP) process. In the CMP process, the spacer layer 205 may act as an etch stop layer. The third material layer 201*a* may be separated into a plurality of the first refractive layers 201 and the second material layer 203*a* may be separated into the second refractive layers 203 by the CMP process. A single first refractive layer 201 and a single second refractive layer 203 may constitute a single nano-post NP.

In some embodiments, each of the components represented by a block, such as those illustrated in FIGS. 1, 6A, 6B, 6C, 6D and 7, may be implemented as various numbers of hardware, software and/or firmware structures that execute respective functions described above, according to embodiments. For example, at least one of these components may include various hardware components including a digital circuit, a programmable or non-programmable logic device or array, an application specific integrated circuit (ASIC), transistors, capacitors, logic gates, or other circuitry using use a direct circuit structure, such as a memory, a processor, a logic circuit, a look-up table, etc., that may execute the respective functions through controls of one or more microprocessors or other control apparatuses. Also, at least one of these components may include a module, a program, or a part of code, which contains one or more executable instructions for performing specified logic functions, and executed by one or more microprocessors or other control apparatuses. Also, at least one of these components may further include or may be implemented by a processor such as a central processing unit (CPU) that performs the respective functions, a microprocessor, or the like. Functional aspects of example embodiments may be implemented in algorithms that execute on one or more processors. Furthermore, the components, elements, modules or units represented by a block or processing operations may employ any number of related art techniques for electronics configuration, signal processing and/or control, data processing and the like.

While aspects of example embodiments have been particularly shown and described, it will be understood that various changes in form and details may be made therein without departing from the spirit and scope of the following claims.

What is claimed is:

1. An image sensor comprising:

a photodetector comprising a plurality of photodetection cells;

an interlayer device provided on the photodetector; and a color separation lens layer comprising a plurality of nano-posts disposed on the interlayer device and spaced apart from each other, the plurality of nano-posts focusing light of different spectra to at least two of the plurality of photodetection cells, wherein each of the plurality of nano-posts comprises a first refractive layer having a first refractive index and a cylindrical shape, and a second refractive layer having a second refractive index and surrounding bottom and side surfaces of the first refractive layer, wherein the second refractive index is higher than the first refractive index, wherein the color separation lens layer comprises a spacer layer between the plurality of nano-posts, and wherein upper surfaces of the first refractive layer, the second refractive layer, and the spacer layer are at a same level.

2. The image sensor of claim 1, wherein the first refractive index is between a third refractive index of the spacer layer and the second refractive index.

3. The image sensor of claim 2, wherein the first refractive layer comprises titanium oxide ($TiO_2$), wherein the second refractive layer comprises hydrogen-doped amorphous silicon (a-Si:H), and wherein the spacer layer comprises silicon oxide ($SiO_2$).

4. The image sensor of claim 2, wherein the upper surfaces of the first refractive layer, the second refractive layer, and the spacer layer are in contact with air.

5. The image sensor of claim 1, wherein each of the plurality of nano-posts has a size smaller than a wavelength of visible light.

6. The image sensor of claim 1, wherein the first refractive layer comprises any one of silicon nitride ($SiN_3$, $Si_3N_4$), zinc sulfide (ZnS), gallium nitride (GaN), zinc selenide (ZnSe), and titanium oxide ($TiO_2$), and wherein the second refractive layer comprises any one of silicon nitride ($Si_3N_4$), zinc sulfide (ZnS), gallium nitride (GaN), zinc selenide (ZnSe), titanium oxide ($TiO_2$), and hydrogen-doped amorphous silicon (a-Si:H).

7. The image sensor of claim 1, wherein the interlayer device comprises a variable interlayer device configured to control a physical distance between the photodetector and the color separation lens layer to vary.

8. The image sensor of claim 1, wherein the color separation lens layer comprises a plurality of color separation areas corresponding to the plurality of photodetection cells, each of which comprises at least one of the plurality of nano-posts, respectively, and wherein the color separation lens layer is configured to focus light of different wavelength spectra to adjacent photodetection cells among the photodetection cells.

9. The image sensor of claim 8, wherein each of the plurality of color separation areas comprises four sections, and wherein the photodetection cells comprises four types respectively corresponding to the four sections, and wherein the plurality of nano-posts of each of the four sections are different in any one or any combination of a shape, a size, and an arrangement thereof.

10. The image sensor of claim 1, wherein a first incident angle of light at a first interface between the first refractive layer and the second refractive layer is greater than a second incident angle of light at a second interface between the second refractive layer and the interlayer device.

11. An image sensor comprising:

a photodetector comprising a plurality of photodetection cells; and a color separation lens layer provided over the photodetector and configured to focus light to the plurality of photodetection cells, the color separation lens layer comprising a plurality of nano-posts spaced apart from each other in a horizontal direction by a plurality of spacer layers, wherein each of the plurality of nano-posts comprises a first refractive layer having a first refractive index and a cylindrical shape, and a second refractive layer having a second refractive index, and surrounding bottom and side surfaces of the first refractive layer, wherein the second refractive index is higher than the first refractive index, wherein upper surfaces of the first refractive layer, the second refractive layer, and the spacer layer are at a same level.

12. The image sensor of claim 11, wherein each of the plurality of spacer layers has a third refractive index lower than the first refractive index, and wherein the color separation lens layer focuses light of different wavelength spectra to at least two of the plurality of photodetection cells.

13. The image sensor of claim 11, wherein the first refractive layer comprises titanium oxide ($TiO_2$), wherein the second refractive layer comprises hydrogen-doped amorphous silicon, and wherein each of the plurality of spacer layers comprises silicon oxide ($SiO_2$).

14. The image sensor of claim 11, wherein each of the plurality of nano-posts has a size smaller than a wavelength of visible light.

15. The image sensor of claim 11, further comprising a variable interlayer device between the photodetector and the color separation lens layer, and configured to control an optical length between the photodetector and the color separation lens layer, wherein the variable interlayer device is configured to control a physical distance between the photodetector and the color separation lens layer to vary.

16. An electronic device comprising:

an imaging device configured to generate an optical image by focusing light reflected from an object;

an image sensor configured to convert the optical image into an electrical signal; and a processor configured to control the imaging device and the image sensor, wherein the image sensor comprises nano-posts which focus light of different spectra to at least two of a plurality of photodetection cells, and a spacer layer between the nano-posts, wherein each of the nano-posts comprises a first refractive layer having a first refractive index and a cylindrical shape, and a second refractive layer having a second refractive index and surrounding bottom and side surfaces of the first refractive layer, wherein the second refractive index is higher than the first refractive index, and wherein upper surfaces of the first refractive layer, the second refractive layer, and the spacer layer are at a same level.

17. The electronic device of claim 16, wherein the image sensor comprises:

a photodetector comprising the plurality of photodetection cells;

a variable interlayer device provided on the photodetector and configured to control an optical distance of light in the electronic device; and a color separation lens layer disposed on the variable interlayer device and comprising the nano-posts, and wherein the spacer layer fills gap spaces between the nano-posts.

18. The electronic device of claim 17, wherein the first refractive layer comprises titanium oxide ($TiO_2$), wherein the second refractive layer comprises hydrogen-doped amorphous silicon, and wherein the spacer layers comprise silicon oxide ($SiO_2$).

19. The electronic device of claim 17, wherein the spacer layers have a third refractive index lower than the first refractive index, and wherein each of the nano-posts has a size smaller than a wavelength of visible light.

20. The electronic device of claim 17, wherein the variable interlayer device is configured to control a physical distance between the photodetector and the color separation lens layer or to change a refractive index thereof to vary.

* * * * *